US012043777B2

United States Patent
Yang et al.

(10) Patent No.: US 12,043,777 B2
(45) Date of Patent: Jul. 23, 2024

(54) THIN FILM AND FABRICATION METHOD THEREFOR AND QLED DEVICE

(71) Applicant: TCL TECHNOLOGY GROUP CORPORATION, Huizhou (CN)

(72) Inventors: Yixing Yang, Huizhou (CN); Luling Cheng, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 509 days.

(21) Appl. No.: 16/907,020

(22) Filed: Jun. 19, 2020

(65) Prior Publication Data

US 2020/0317997 A1 Oct. 8, 2020

Related U.S. Application Data

(63) Continuation of application No. PCT/CN2018/123689, filed on Dec. 26, 2018.

(30) Foreign Application Priority Data

| Dec. 26, 2017 | (CN) | 201711431438.5 |
| Dec. 26, 2017 | (CN) | 201711433458.6 |
| Dec. 26, 2017 | (CN) | 201711435211.8 |
| Dec. 26, 2017 | (CN) | 201711435542.1 |
| Dec. 26, 2017 | (CN) | 201711435544.0 |

(51) Int. Cl.
| C09K 11/02 | (2006.01) |
| C09D 5/24 | (2006.01) |
| C09D 139/04 | (2006.01) |
| C09D 165/00 | (2006.01) |
| C09K 11/56 | (2006.01) |
| C09K 11/88 | (2006.01) |
| H10K 50/115 | (2023.01) |
| H10K 85/10 | (2023.01) |
| C08K 3/30 | (2006.01) |

(52) U.S. Cl.
CPC ............... *C09K 11/02* (2013.01); *C09D 5/24* (2013.01); *C09D 139/04* (2013.01); *C09D 165/00* (2013.01); *C09K 11/565* (2013.01); *C09K 11/883* (2013.01); *H10K 85/111* (2023.02); *H10K 85/115* (2023.02); *H10K 85/151* (2023.02); *C08K 3/30* (2013.01); *C08K 2003/3045* (2013.01); *C08K 2201/001* (2013.01); *C08K 2201/011* (2013.01); *H10K 50/115* (2023.02); *H10K 85/1135* (2023.02)

(58) Field of Classification Search
CPC ..... C09K 11/02; C09K 11/565; C09K 11/883; C09D 5/24; C09D 139/04; C09D 165/00; H01L 51/0035; H01L 51/0039; H01L 51/0043; H01L 51/0037; H01L 51/502; C08K 3/30; C08K 2003/3045; C08K 2201/001; C08K 2201/011
See application file for complete search history.

(56) References Cited

U.S. PATENT DOCUMENTS

| 2001/0003602 A1* | 6/2001 | Fujita | H10K 71/15 427/64 |
| 2005/0147842 A1* | 7/2005 | Hirayama | H10K 50/00 313/506 |
| 2006/0040137 A1* | 2/2006 | Kambe | C09K 11/06 257/88 |
| 2009/0039764 A1* | 2/2009 | Cho | H10K 50/115 313/504 |
| 2009/0087792 A1* | 4/2009 | Iizumi | H05B 33/10 430/312 |
| 2010/0097691 A1 | 4/2010 | Memon et al. | |
| 2016/0343949 A1 | 11/2016 | Seo et al. | |

FOREIGN PATENT DOCUMENTS

| CN | 101810056 A | 8/2010 |
| CN | 102473800 A | 5/2012 |
| CN | 103554925 A | 2/2014 |
| CN | 103904178 A | 7/2014 |
| CN | 103946147 A | 7/2014 |
| CN | 105694590 A | 6/2016 |
| CN | 106206965 A | 12/2016 |
| CN | 106356462 A | 1/2017 |
| CN | 106433611 A | 2/2017 |
| CN | 106449949 A | 2/2017 |
| CN | 106486571 A | 3/2017 |
| CN | 106519799 A | 3/2017 |
| CN | 106531892 A | 3/2017 |
| CN | 106590663 A | 4/2017 |
| CN | 106855199 A | 6/2017 |
| CN | 106910814 A | 6/2017 |
| CN | 107203016 A | 9/2017 |

(Continued)

OTHER PUBLICATIONS

Enhanced electroluminescence from MEH-PPV-POSS:CuInS2 nanocomposite based organic light emitting diode, G. Saygili et al. / Synthetic Metals 161 (2011) 196-202.*
Measurement of the Charge Carrier Mobility in MEH-PPV and MEH-PPV-POSS Organic Semiconductor Films, Romanov et al., Russian Physics Journal, vol. 57, No. 11, Mar. 2015.*
Stabilization of Semiconducting Polymers with Silsesquioxane, Xiao et al. Adv. Funct. Mater. 2003, 13, No. 1, January.*
Solution-processed planar white light-emitting diodes based on cadmium-free Cu—In—Zn—S/ZnS quantum dots and polymer, Z. Liu et al. / Organic Electronics 45 (2017) 20-25.*

(Continued)

*Primary Examiner* — Haidung D Nguyen
(74) *Attorney, Agent, or Firm* — ANOVA LAW GROUP, PLLC

(57) ABSTRACT

A thin film includes a polymer material and quantum dots (QDs). The QDs are dispersed in the polymer material. The polymer material includes at least one barrier polymer material. A weight average molecular weight of the at least one barrier polymer material is higher than 100,000.

19 Claims, 3 Drawing Sheets

(56) References Cited

FOREIGN PATENT DOCUMENTS

| | | |
|---|---|---|
| CN | 107383402 A | 11/2017 |
| CN | 107400414 A | 11/2017 |
| CN | 206685416 U | 11/2017 |
| GB | 2516930 A | 2/2015 |
| JP | 2003138252 A | 5/2003 |
| WO | 2014057968 A1 | 4/2014 |
| WO | 2017068781 A1 | 4/2017 |
| WO | 2017080325 A1 | 5/2017 |

OTHER PUBLICATIONS

Synthesis and properties of poly(p-phenylene vinylene) derivatives with hyperbranched structure and containing a nitro substituent, Li et al., Monatsh Chem (2014) 145:85-90 (Year: 2014).*

High-efficiency deep-red quantum-dot lightemitting diodes with type-II CdSe/CdTe core/shell quantum dots as emissive layers, Lin et al., J. Mater. Chem. C, 2016, 4, 7223-7229.*

Electrospun polymer/quantum dot composite fibers as down conversion phosphor layers for white light-emitting diodes, Min et al., RSC Adv., 2014, 4, 11585-11589.*

Development of Colloidal Quantum Dots for Electrically Driven Light-Emitting Devices, Han et al., Journal of the Korean Ceramic Society, vol. 54, No. 6, p. 449~469, 2017.*

Precise optical modeling of quantum dots for white lightemitting diodes, Scientific Reports , 7: 16663, Xie et al., 2017.*

Fulin Zhao, "Oil Recovery Chemistry," University of Petroleum, (1989).

Caiyuan Pan, "High Polymer Chemistry," University of Science and Technology of China, (1997).

World Intellectual Property Organization (WIPO) International Search Report for PCT/CN2018/123689 Mar. 29, 2019 5 Pages.

* cited by examiner ation No. 201711435211.8, application No. 201711435542.1,
THIN FILM AND FABRICATION METHOD THEREFOR AND QLED DEVICE

CROSS-REFERENCE TO RELATED APPLICATION

This application is a continuation of International Application No. PCT/CN2018/123689, filed on Dec. 26, 2018, which claims priority to Chinese patent applications all filed on Dec. 26, 2017 and having application No. 201711431438.5, application No. 201711435544.0, application No. 201711435211.8, application No. 201711435542.1, and application No. 201711433458.6, the contents of all of which are incorporated herein by reference in their entirety.

TECHNICAL FIELD

The present disclosure generally relates to the quantum dot (QD) technology field and, more particularly, to a thin film, a formation method thereof, and a quantum light-emitting diode (QLED) device.

BACKGROUND

Quantum dot (QD) is a special material having all three dimensions in nanoscale. The remarkable quantum confinement effect makes the QD have many unique nano properties, such as continuously adjustable emission wavelength, narrow emission wavelength, wide absorption spectrum, high luminous intensity, long fluorescence life, good biocompatibility, etc. The QD has broad application prospects in the fields of biomarkers, flat panel displays, solid-state lighting, photovoltaic solar energy, etc.

In typical electroluminescence display applications, the QD is usually formed separately to form a emissive layer containing only QD material. This is different from organic light-emitting diode devices (OLEDs). In an OLED, the emissive material (or guest material) is usually doped in the host material with a certain concentration to form a thin film. In the emissive layer having a host-guest mixed material, holes and electrons are first injected into the conduction band and valence band energy levels of the host material through the respective transport layer material to form excitons. The excitons do not tend to recombine at this point. Instead, the excitons are transferred to the guest material by the way of energy transfer. In the guest material, the excitons recombine and emit photons of a corresponding wavelength. In the OLED, the guest organic molecule does not have a function of energy level binding, so if a thin film is formed separately to form a emissive layer containing only the guest material, very strong non-radiative energy transfer and concentration quenching may occur. Therefore, the host-guest mixed system is a more effective way to obtain high luminous efficiency for the OLED.

However, for the quantum dot light-emitting diode (QLED), since the QD has a core-shell structure, the high-quality QD has good energy level binding and corresponding exciton binding capabilities. Therefore, the QD material can be served as a emissive layer to achieve a device luminous efficiency. The device structure made by the QD material is simpler, with reduced exciton loss path.

However, some QDs have some design limitations due to the core-shell structure. The design limitations can cause the limitations of the energy level binding and the corresponding exciton binding capabilities. Although the QDs can show a higher luminescence quantum yield in the solution state (i.e., the distance between the QD particles is relatively large), the luminous efficiency will be significantly reduced due to the strong non-radiative energy transfer and concentration quenching in a solid thin film (i.e., close packing between QD particles). Therefore, the efficiency of the QLED device based on such QDs is low.

Therefore, for the QDs with the limited energy level binding and exciton binding capacities, the design and formation method of the corresponding QLED device needs to be improved.

SUMMARY

Embodiments of the present disclosure provide a thin film, including a polymer material and quantum dots (QDs). The QDs are dispersed in the polymer material. The polymer material includes at least one barrier polymer material. A weight average molecular weight of the at least one barrier polymer material is higher than 100,000.

Embodiments of the present disclosure provide a method for forming a thin film. The method includes mixing quantum dots (QDs) and a polymer material in a dispersion medium to form a mixed solution and forming a thin film from the mixed solution. The thin film includes the polymer material and the quantum dots (QDs) dispersed in the polymer material. The polymer material includes at least one barrier polymer material. A weight average molecular weight of the at least one barrier polymer material is higher than 100,000.

Embodiments of the present disclosure provide a quantum dot light-emitting diode (QLED) device, including a quantum dot (QD) emissive layer. The quantum dot (QD) emissive layer includes a thin film. The thin film includes a polymer material and quantum dots (QDs). The QDs are dispersed in the polymer material. The polymer material includes at least one barrier polymer material. A weight average molecular weight of the at least one barrier polymer material is higher than 100,000.

DETAILED DESCRIPTION OF THE EMBODIMENTS

Figure 1:
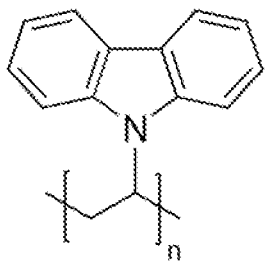
FIG. 1 illustrates a structural formula of poly (9-Vinyl Carbazole) (PVK) according to some embodiments of the present disclosure.

To make the objectives, technical solutions, and effects of the present disclosure clearer, the present disclosure is further described in detail below. Implementations and specific embodiments described here are merely used to describe the present disclosure but do not limit the present disclosure.

Some quantum dots (QDs) with core-shell structures may have limited binding capabilities in energy level and exciton. Although the QDs can show a higher luminescence quantum yield in a solution state (e.g., having a distance between the QD particles is relatively large), luminous efficiency is significantly reduced due to strong non-radiative energy transfer and concentration quenching in a solid thin film (e.g., having dense packing between QD particles). When the core-shell structure of the QDs cannot bind electron clouds or excitons well at an energy level, the electron clouds or excitons are easier to diffuse to a surface of the QDs. At this point, if the distance between the QDs is very close with strong interaction (e.g., as in the case of a solid thin film), the electron clouds or excitons diffused to the surface of the QDs interact strongly. As such, strong non-radiation energy transfer and concentration quenching may occur, which makes the QD luminescence quantum yield in solid thin films significantly be reduced. Therefore, the efficiency of a quantum dot light-emitting diode (QLED) device including the solid thin film is also significantly reduced.

Therefore, for QDs with the core-shell structure which cannot provide enough energy level binding and exciton binding, use of pure QD material as the QD emissive layer thin film in the QLED device cannot provide desirable effect.

For QDs with the core-shell structure which cannot provide enough energy level binding and exciton binding, to increase the distance between the QDs to reduce the interaction between the QDs and minimize the non-radiation energy transfer and concentration quenching between the QDs, the QDs are mixed with the polymer material to form the thin film. The polymer material is used to effectively separate the QDs from each other and increase the mutual distance between the QDs. The addition of the polymer material reduces the interaction between the QDs and maximizes suppression of the non-radiative energy transfer and concentration quenching between the QDs to improve the QD thin film luminescence quantum yield. The QD thin film with high luminescence quantum yield is used in the QLED device to realize a high-efficiency QLED device.

Embodiments of the present disclosure provide a thin film. The thin film includes a polymer material and QDs dispersed in the polymer material. The polymer material includes at least one barrier polymer material, and the weight average molecular weight of the barrier polymer material is higher than 100,000.

The thin film of the embodiments of the present disclosure includes the QDs and the polymer material. The polymer material is used to effectively separate the QDs from each other and increase the mutual distance between the QDs. The addition of the polymer material reduces the interaction between the QDs and maximizes the suppression of the non-radiative energy transfer and concentration quenching between the QDs to improve the QD thin film luminescence quantum yield. If the molecular weight of the barrier polymer material is too small, the barrier polymer material is unable to achieve sufficient isolation effect. Therefore, the weight average molecular weight of the barrier polymer material needs to be higher than 100,000 to be able to obtain effective isolation of the QDs. The higher the molecular weight of the barrier polymer material is, the better the isolation effect between the QDs is, and the weight content of the QDs contained in the QD thin film is thus higher. When using the QD thin film with high luminescence quantum yield in the QLED device, a high-efficiency QLED device may be provided.

The thin film of the embodiments of the present disclosure includes one or more barrier polymer materials. The weight average molecular weight of the barrier polymer material is higher than 100,000. If the molecular weight of the barrier polymer material is too small, the barrier polymer material is unable to achieve sufficient isolation effect. The higher the molecular weight of the barrier polymer material is, the better the isolation effect between the QDs is, and the weight content of the QDs contained in the QD thin film is thus higher.

In some embodiments, the QDs are oil-soluble QDs or water-soluble QDs.

In some specific embodiments, the QDs are oil-soluble QDs. The surface ligand of the oil-soluble QDs includes thiol or carboxylic acid.

In some specific embodiments, the QDs include one or more of group II-VI QDs, group III-V QDs, and group IV-VI QDs. In some specific embodiments, the QDs include one or more of: single QDs of group II-VI, group III-V, group IV-VI; core-shell type QDs of group II-VI, group III-V, group IV-VI; and mixed type QDs. In some specific embodiments, the group II-VI single QD includes one of CdSe, CdS, ZnSe, ZnS, CdTe, ZnTe, CdZnS, CdZnSe, CdZnTe, ZnSeS, ZnSeTe, ZnTeS, CdSeS, CdSeTe, CdTeS, CdZnSeS, CdZnSeTe, CdZnSTe, ZnSee, ZnSee, etc. The group III-V single QD includes one of InP, GaP, GaAs, InAs, InAsP, GaAsP, InGaP, InGaAs, InGaAsP, etc. The group IV-VI single QD includes one of PbS, PbSe, PbTe, PbSeS, PbSeTe, PbSTe, etc. The core-shell QD includes CdZnSe/ZnS, CdZnSeS ZnS, CdTe/ZnS, CdZnSe/ZnS, CdZnSeS/ZnS, CdTe/ZnS, CdTe/CdSe, CdTe/ZnTe, CdSe/CdS, CdSe/ZnS, etc. The mixed QDs include CdTe/CdS/ZnS, etc.

In some specific embodiments, the QDs include the group II-VI QDs.

In some specific embodiments, the QDs include Te-containing group II-VI QDs. The Te-containing group II-VI QDs have a narrower bandgap than Se containing group II-VI QDs. Therefore, when forming the emissive QDs in a visible band (green or red), the QDs cannot grow a thicker shell to avoid an excessive red-shift of a emissive wavelength. Therefore, the distance between the QDs can be very close, and the phenomenon of the strong interaction in the solid thin film is more prominent in the Te-containing group II-VI QDs. The strong non-radiative energy transfer and concentration quenching in the solid thin film result in a significant decrease in the luminous efficiency of the Te-containing group II-VI QDs. Therefore, for the QLED device including the Te-containing group II-VI QDs, an effective avoidance of the quenching of the luminous efficiency between the QDs in the QD emissive layer thin film is especially important. In some specific embodiments, the QDs include Cd and Te containing (or Cd—Te-containing) group II-VI QDs. In some specific embodiments, the QDs include one of CdTe, CdTeS, or core-shell QDs with CdTe or CdTeS as the core. Since Cd and Te containing QDs, such as CdTe and CdTeS, have a deeper conduction band energy level than other Te-containing group II-VI QDs, the binding effect on the electrons is better. Therefore, the same method to avoid the quenching of luminous efficiency produces better effects on CdTe, CdTeS, etc.

In some embodiments, the carrier mobility of the barrier polymer material is above $10^{-8}$ cm$^2$V$^{-1}$ s$^{-1}$. Since the thin film containing the barrier polymer material and QDs is used as the emissive layer in the QLED device application, and the charge transport in the barrier polymer material needs to be considered after the charge is injected into the thin film, the carrier mobility of the barrier polymer material needs to meet certain requirements (e.g., above $10^{-8}$ cm$^2$V$^{-1}$ s$^{-1}$).

In some embodiments, the weight average molecular weight of the barrier polymer material is higher than 200,000. The higher the molecular weight of the barrier polymer material is, the better the isolation effect between the QDs is. The selection of the barrier polymer material with the weight average molecular weight higher than 200,000 can further improve the isolation effect between the QDs, to further improve the luminescence quantum yield of the QDs in the thin film.

In some embodiments, the weight average molecular weight of the barrier polymer material is higher than 300,000.

In some embodiments, the weight average molecular weight of the barrier polymer material is higher than 500,000.

Figure 2:
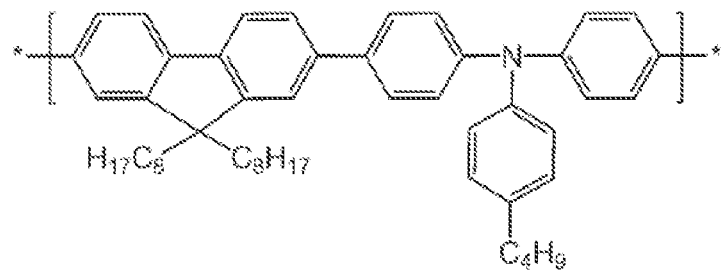
FIG. 2 illustrates a structural formula of poly (9,9-dioctylfluorene-alt-N-(4-sec-butylphenyl)-diphenylamine) (TFB) according to some embodiments of the present disclosure.
Figure 3:
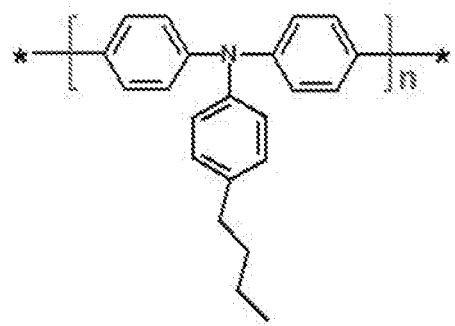
FIG. 3 illustrates a structural formula of poly (N,N'-Bis (3-methylphenyl)-N,N'-diphenylbenzidine (poly-TPD) according to some embodiments of the present disclosure.
Figure 4:
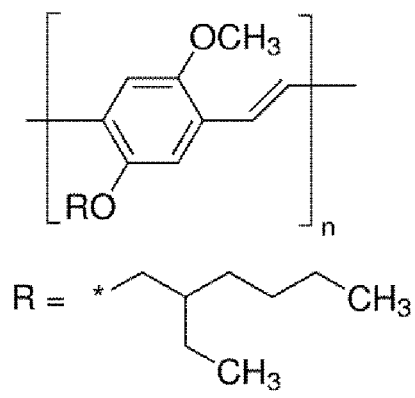
FIG. 4 illustrates a structural formula of poly (2-methoxy-5-(2'-ethylhexyloxy)-1,4-P-phenylacetylene) (MEH-PPV) according to some embodiments of the present disclosure.
Figure 5:
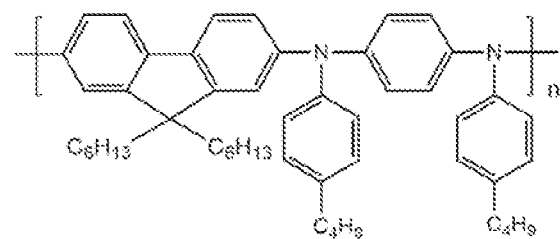
FIG. 5 illustrates a structural formula of a derivative of poly (9-Vinyl Carbazole) (PVK) according to some embodiments of the present disclosure.
Figure 6:
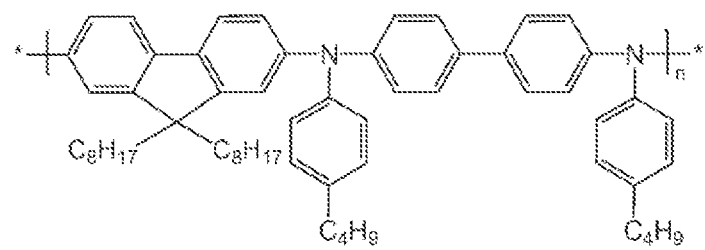
FIG. 6 illustrates a structural formula of another derivative of poly (9-Vinyl Carbazole) (PVK) according to some embodiments of the present disclosure.
Figure 7:
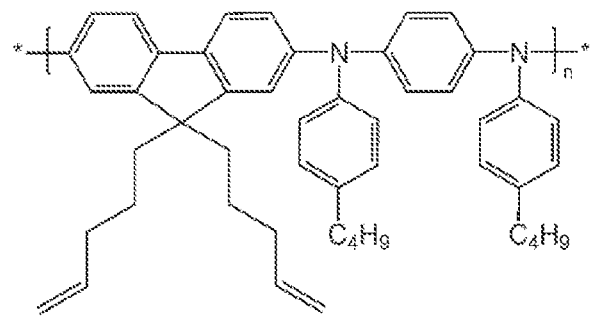
FIG. 7 illustrates a structural formula of another derivative of poly (9-Vinyl Carbazole) (PVK) according to some embodiments of the present disclosure.

In some embodiments, the barrier polymer material includes one of PVK (i.e., poly (9-Vinyl Carbazole)) and its derivatives with a weight average molecular weight of more than 500,000, TFB (i.e., poly (9,9-dioctylfluorene-alt-N-(4-sec-butylphenyl)-diphenylamine)) and its derivatives with a weight average molecular weight of more than 500,000, poly-TPD (i.e., poly(N,N'-Bis(3-methylphenyl)-N,N'-diphenylbenzidine) and its derivatives with a weight average molecular weight higher than 500,000, and MEH-PPV (i.e., poly (2-methoxy-5-(2'-ethylhexyloxy)-1,4-P-phenylacetylene)) and its derivatives with a weight average molecular weight higher than 500,000. FIG. 1 shows structure formula of PVK. FIG. 2 shows the structure formula of TFB. FIG. 3 shows the structure formula of poly-TPD. FIG. 4 shows the structure formula of MEH-PPV. In some specific embodiments, the derivatives of TFB may include any of the structural molecules in FIG. 5 to FIG. 7. The selection of the average barrier polymer material mentioned above can maximize the isolation effect between the QDs to further improve the luminescence quantum yield of the QDs in the thin film.

In some embodiments, the thin film includes the QDs and the barrier polymer material. The mass fraction of the QDs in the thin film is 0.5-90%. In other words, the thin film described in the present embodiment contains only one specific polymer material. The weight average molecular weight of the barrier polymer material is higher than 100,000. The higher the molecular weight of the barrier polymer material is, the better the isolation effect between the QDs is, and the weight content of the QDs that can be accommodated in the thin film is therefore higher.

In some specific embodiments, the weight average molecular weight of the barrier polymer material is between 100,000 and 300,000, and the mass fraction of the QDs in the thin film is 0.5-30%.

In some specific embodiments, the weight average molecular weight of the barrier polymer material is between 300,000 and 500,000, and the mass fraction of the QDs in the thin film is 0.5-66%.

In some specific embodiments, the weight average molecular weight of the barrier polymer material is between 500,000 and 1500,000, and the mass fraction of the QDs in the thin film is 0.5-90%.

The higher the molecular weight of the barrier polymer material is, the better the isolation effect between the QDs is, and the weight content of the QDs that can be accommodated in the thin film is therefore higher.

In some specific embodiments, the mass fraction of the QDs in the thin film is 0.5-20%.

In some specific embodiments, the mass fraction of the QDs in the thin film is 2-10%.

In some specific embodiments, the carrier mobility of the barrier polymer material is above $10^{-6}$ cm$^2$V$^{-1}$ s$^{-1}$ to further enhance the charge transport in the thin film.

In some embodiments, the thin film includes QDs and two barrier polymer materials. In other words, the thin film described in the present embodiment contains two specific polymer materials. The weight average molecular weights of the two barrier polymer materials are higher than 100,000. The mass fraction of the QDs in the thin film is 0.5-90%. The higher the molecular weight of the two barrier polymer materials is, the better the isolation effect between the QDs is, and the weight content of the QDs that can be accommodated in the thin film is therefore higher.

The weight average molecular weight of the barrier polymer material is between 500,000 and 1500,000, and the mass fraction of the QDs in the thin film is 0.5-90%. In some specific embodiments, the mass fraction of the QDs in the thin film is 0.5-20%.

In some specific embodiments, the mass fraction of the QDs in the thin film is 2-10%.

In some specific embodiments, the carrier mobility of the barrier polymer material is above $10^{-6}$ cm$^2$V$^{-1}$ s$^{-1}$ to further enhance the charge transport in the thin film.

In some embodiments, the polymer material further includes at least one charge transport regulating polymer material. The weight average molecular weight of the charge transport regulating polymer material is lower than 100,000. The mass fraction of the charge transport regulating polymer material in the polymer material is less than 10%. In other words, the polymer material of embodiments of the present disclosure includes at least one barrier polymer material and one charge transport regulating polymer material. The weight average molecular weight of the barrier polymer material is higher than 100,000, and the weight average molecular weight of the charge transport regulating polymer material is lower than 100,000. The higher the molecular weight of the barrier polymer material is, the better the isolation effect between the QDs is, and the weight content of the QDs that can be accommodated in the thin film is therefore higher. The addition of the charge transport regulating polymer material can regulate the charge transport performance of the thin film applied in the QLED device and can ensure that the luminescence quantum yield of the thin film is not affected.

When the carrier mobility of the barrier polymer material is too high (above $10^{-6}$ cm$^2$ V$^{-1}$ s$^{-1}$), a charge transport regulating polymer material is necessary to be added to the thin film. In this case, the charge transport regulating polymer material needs to be non-conducting polymer to effectively control and regulate the transfer of charge in the thin film.

In some specific embodiments, the polymer material includes a barrier polymer material and one charge transport regulating polymer material. In other words, the polymer material of embodiments of the present disclosure only includes one barrier polymer material and one charge transport regulating polymer material. The weight average molecular weight of the barrier polymer material is higher than 100,000, The weight average molecular weight of the charge transport regulating polymer material is lower than 100,000. The higher the molecular weight of the barrier polymer material is, the better the isolation effect between the QDs is, and the weight content of the QDs can therefore be accommodated in the thin film.

The weight average molecular weight of the barrier polymer material is between 500,000 and 1500,000, and the mass fraction of the QDs in the thin film is 0.5-90%. In some specific embodiments, the mass fraction of the QDs in the thin film is 0.5-20%.

In some specific embodiments, the mass fraction of the QDs in the thin film is 2-10%.

In some specific embodiments, the carrier mobility of the barrier polymer material is below $10^{-6}$ $cm^2V^{-1}$ $s^{-1}$. The charge transport regulating polymer material includes conducting polymers to enhance the transport of the charge in the thin film. The mass fraction of the charge transport regulating polymer material is 0.5-5% of the polymer material. In some specific embodiments, the conducting polymer includes one of polyacetylene, polyphenylene sulfide, polyaniline, polypyrrole, polythiophene, etc.

In some embodiments, the carrier mobility of the barrier polymer material is above $10^{-6}$ $cm^2V^{-1}$ $s^{-1}$. The charge transport regulating polymer material includes the non-conducting polymers to control the transport of the charge in the thin film. The mass fraction of the charge transport regulating polymer material is 5-10% of the polymer material. In some specific embodiments, the non-conducting polymer includes one of phenolic resin, polyethylene, polydimethylsiloxane (PDMS), polystyrene, polymethacrylate, polyacrylate, polycarbonate, etc.

In some embodiments, the thin film includes the QDs and the polymer material. The polymer material includes two barrier polymer material and one charge transport regulate polymer material.

The weight average molecular weight of the barrier polymer material is between 500,000 and 1500,000, and the mass fraction of the QDs in the thin film is 0.5-90%. In some specific embodiments, the mass fraction of the QDs in the thin film is 0.5-20%. In some specific embodiments, the mass fraction of the QDs in the thin film is 2-10%.

In some specific embodiments, the carrier mobility of the barrier polymer material is below $10^{-6}$ $cm^2$ $V^{-1}$ $s^{-1}$. The charge transport regulating polymer material includes conducting polymers to enhance the transport of the charge in the thin film. The mass fraction of the charge transport regulating polymer material is 0.5-5% of the polymer material. In some specific embodiments, the conducting polymer includes one of polyacetylene, polyphenylene sulfide, polyaniline, polypyrrole, and polythiophene.

In some embodiments, the carrier mobility of the barrier polymer material is above $10^{-6}$ $cm^2$ $V^{-1}$ $s^{-1}$. The charge transport regulating polymer material includes the non-conducting polymers to control the charge transport in the thin film. The mass fraction of the charge transport regulating polymer material is 5-10% of the polymer material. In some specific embodiments, the non-conducting polymer includes one of phenolic resin, polyethylene, polydimethylsiloxane (PDMS), polystyrene, polymethacrylate, polyacrylate, and polycarbonate.

Figure 8:
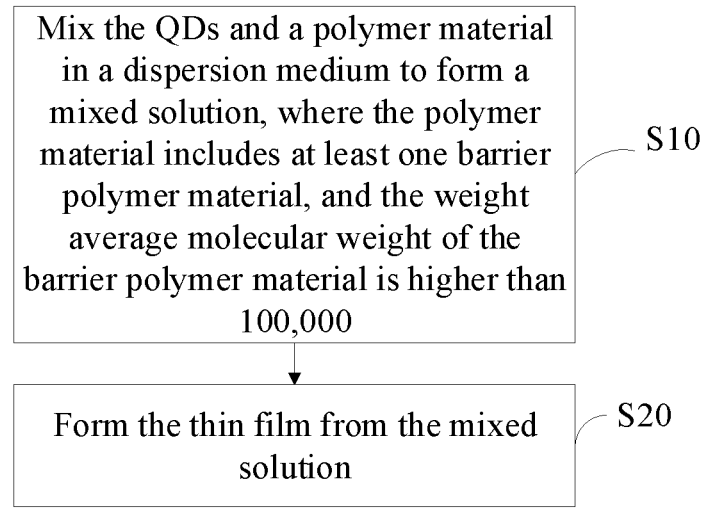
FIG. 8 illustrates a flowchart for forming a thin film according to some embodiments of the present disclosure.

Embodiments of the present disclosure also provide a flow chart of the thin film formation method shown in FIG. 8.

At S10, QDs and polymer material are mixed in a dispersion medium to form a mixed solution.

At S20, the thin film is formed from the mixed solution.

The mentioned polymer material includes at least one barrier polymer material. The weight average molecular weight of the barrier polymer material is higher than 100,000.

In some embodiments, the dispersion medium includes organic solvents. In some specific embodiments, the organic solvent includes non-polar organic solvents. In some specific embodiments, the non-polar organic solvent may include one of chloroform, toluene, chlorobenzene, n-hexane, n-octane, decalin, tridecane, n-octylbenzene, trioctylphosphine (TOP), tributylphosphine (TBP), octadecene (ODE), oleic acid (OA), octadecylamine (ODA), trioctylamine (TOA) and oleylamine (OAm), etc.

In some embodiments, a solution method is used to make the mixed solution into a thin film to obtain the above-mentioned thin film. In some specific embodiments, the solution method includes one of the spin coating methods, printing method, blade coating method, dip-pull method, dipping method, spraying method, roll coating method, casting method, slot coating method, strip coating method, etc.

Embodiments of the present disclosure further provide a QLED device. The QLED device includes a QD emissive layer. The QD emissive layer is the thin film of the present disclosure. The embodiment of the present disclosure applies the thin film with high luminescence quantum yield to a QLED device to achieve a high-efficiency QLED device.

In some embodiments, the thickness of the thin film is 10-80 nm.

The embodiments of the present disclosure will be described in detail through the following examples.

In some embodiments, an exemplary formation method 1 of thin films with different weight percentages of the QDs includes the following steps.

1) 20 mg of CdTe/CdZnS core-shell QDs are weighed and dissolved in 10 mL of chlorobenzene to form a QD solution with a concentration of 2 mg/mL. The luminescence peak of this QD solution is at a wavelength of 631 nm, the half-peak width is 30 nm, and the luminescence quantum yield is 56%.

2) 40 mg, 30 mg, 20 mg, 10 mg, 8 mg, 4 mg, 2 mg, 1 mg, 0.5 mg, 0.3 mg, and 0.1 mg of PVK (weight average molecular weight 1100, 000) are weighed separately, and separately dissolved in 0.5 mL of chlorobenzene completely.

3) 0.5 mL of the QD solution prepared in step 1) is added to the above PVK chlorobenzene solution and mixed thoroughly to form PVK/QD chlorobenzene solutions, having weight concentrations (mg/mL) of 40/1, 30/1, 20/1, 10/1, 8/1, 4/1, 2/1, 1/1, 0.5/1, 0.3/1, and 0.1/1, respectively.

4) Thin films are formed under an inert atmosphere environment by a spin-coating process of the above chlorobenzene solution, followed by an annealing process at a temperature of 120° C. for 15 minutes. Thin films with different weight percentages of QDs are then formed.

In some embodiments, the addition of the barrier polymer material improves the luminescence quantum yield of the thin film.

The luminescence quantum yield of each thin film formed by the exemplary formation method 1 is shown in Table 1. Compared to the thin film (last row in Table 1) formed by pure QD material, adding different proportions of the barrier polymer material (PVK in the embodiment) to the thin film can significantly may improve the luminescence quantum yield of the thin film, e.g., increase the luminescence quantum yield of the thin film from 3% for the pure thin film to 53%. The luminescence quantum yield of the thin film added with the barrier polymer material is nearly close to the luminescence quantum yield of the QDs in solution, which indicates that PVK polymer has a desirable isolation effect on the QDs in the thin film. In this example, PVK has a large weight average molecular weight (1100,000), and for QDs having a weight percentage in a wide range of 2-90%, the luminous efficiency is improved.

TABLE 1

| PVK:QD weight concentration ratio (mg/mL) | QD weight percentage (%) | Luminescence quantum yield of thin film (%) |
| --- | --- | --- |
| 40:1 | 2.4 | 53 |
| 30:1 | 3.2 | 37 |
| 20:1 | 4.8 | 28 |
| 10:1 | 9.1 | 22 |
| 8:1 | 11.1 | 16 |
| 4:1 | 20.0 | 15 |
| 2:1 | 33.3 | 12 |
| 1:1 | 50.0 | 9 |
| 0.5:1 | 66.7 | 7 |
| 0.3:1 | 76.9 | 7 |
| 0.1:1 | 90.9 | 5 |
| 0.0:1 | 100 | 3 |

In some embodiments, an exemplary formation method 2 of thin films with different weight percentages of the QDs includes the following steps.

1) 20 mg of CdTe/CdZnS core-shell QDs are weighed and dissolved in 10 mL of chlorobenzene to form a QD solution with a concentration of 2 mg/mL. The luminescence peak of this QD solution is at a wavelength of 631 nm, the half-peak width is 30 nm, and the luminescence quantum yield is 56%.

2) 40 mg, 30 mg, 20 mg, 10 mg, 8 mg, 4 mg, 2 mg, 1 mg, 0.5 mg, 0.3 mg, and 0.1 mg of PVK (weight average molecular weight 500,000) are weighed separately, and separately dissolved in 0.5 mL of chlorobenzene completely.

3) 0.5 mL of the QD solution prepared in step 1) is added to the above PVK chlorobenzene solution and mixed thoroughly to form PVK/QD chlorobenzene solutions, having weight concentrations (mg/mL) of 40/1, 30/1, 20/1, 10/1, 8/1, 4/1, 2/1, 1/1, 0.5/1, 0.3/1, and 0.1/1, respectively.

4) Thin films are formed under an inert atmosphere environment by a spin-coating process of the above chlorobenzene solution, followed by an annealing process at a temperature of 120° C. for 15 minutes. Thin films with different weight percentages of QDs are then formed.

In some embodiments, the addition of the barrier polymer material improves the luminescence quantum yield of thin film.

The luminescence quantum yield of each thin film formed by the exemplary formation method 2 of above-mentioned embodiments is shown in Table 2. Compared with the thin film (last row in Table 2) formed by the pure QD material, adding different proportions of the barrier polymer material (PVK in the embodiment) to the thin film can significantly improve the luminescence quantum yield of the thin film, e.g., increase the luminescence quantum yield of the thin film from 3% for the pure thin film to 52%. The luminescence quantum yield of the thin film added with the barrier poly material is nearly close to the luminescence quantum yield of the QDs in solution, which indicates that PVK polymer has a desirable isolation effect on the QDs in the thin film. In this example, PVK has a large weight average molecular weight (500,000), and for QDs having a weight percentage in a wide range of 2-66%, the luminous efficiency is improved.

TABLE 2

| PVK:QD weight concentration ratio (mg/mL) | QD weight percentage (%) | Luminescence quantum yield of thin film (%) |
| --- | --- | --- |
| 40:1 | 2.4 | 52 |
| 30:1 | 3.2 | 38 |
| 20:1 | 4.8 | 27 |
| 10:1 | 9.1 | 22 |
| 8:1 | 11.1 | 14 |
| 4:1 | 20.0 | 13 |
| 2:1 | 33.3 | 10 |
| 1:1 | 50.0 | 8 |
| 0.5:1 | 66.7 | 8 |
| 0.3:1 | 76.9 | 4 |
| 0.1:1 | 90.9 | 3 |
| 0.0:1 | 100 | 3 |

In some embodiments, an exemplary formation method 3 of the thin films with different weight percentages of QDs includes the following steps.

1) 20 mg of CdTe/CdZnS core-shell QDs are weighed and dissolved in 10 mL of chlorobenzene to form a QD solution with a concentration of 2 mg/mL. The luminescence peak of this QD solution is at a wavelength of 628 nm, the half-peak width is 32 nm, and the luminescence quantum yield is 54%.

2) 40 mg, 30 mg, 20 mg, 10 mg, 8 mg, 4 mg, 2 mg, 1 mg, 0.5 mg, 0.3 mg, and 0.1 mg of TFB (weight average molecular weight 200,000) are weighed separately, and separately dissolved in 0.5 mL of chlorobenzene completely.

3) 0.5 mL of the QD solution prepared in step 1) is added to the above TFB chlorobenzene solution and mixed thoroughly to form TFB/QD chlorobenzene solutions, having weight concentrations (mg/mL) of 40/1, 30/1, 20/1, 10/1, 8/1, 4/1, 2/1, 1/1, 0.5/1, 0.3/1, and 0.1/1, respectively.

4) Thin films are formed under an inert atmosphere environment by a spin-coating process of the above chlorobenzene solution, followed by an annealing process at a temperature of 110° C. for 15 minutes. Thin films with different weight percentages of QDs are then formed.

In some embodiments, the addition of the barrier polymer material improves the luminescence quantum yield of the thin film.

The luminescence quantum yield of each thin film formed by the exemplary formation method 3 of above-mentioned embodiments is shown in Table 3. Compared with the thin film (last row in Table 3) formed by the pure QD material, adding different proportions of the barrier polymer material (TFB in the embodiment) to the thin film can significantly improve the luminescence quantum yield of the thin film, e.g., increase the luminescence quantum yield of the thin film from 3% for the pure thin film to 48%. The luminescence quantum yield of the thin film added with the barrier polymer material is nearly close to the luminescence quantum yield of the QDs in solution, which indicates that TFB polymer has a desirable isolation effect on the QDs in the thin film. In this example, TFB has a large weight average molecular weight (200,000), and for QDs having a weight percentage in a wide range of 2-30%, the luminous efficiency is improved. Compared with the Table 1 and Table 2 of above-mentioned embodiments, when the weight average molecular weight of the barrier polymer increases, the range of the QD weight percentage that can improve the efficiency is larger.

TABLE 3

| TFB:QD weight concentration ratio (mg/mL) | QD weight percentage (%) | Luminescence quantum yield of thin film (%) |
|---|---|---|
| 40:1 | 2.4 | 48 |
| 30:1 | 3.2 | 35 |
| 20:1 | 4.8 | 28 |
| 10:1 | 9.1 | 19 |
| 8:1 | 11.1 | 15 |
| 4:1 | 20.0 | 12 |
| 2:1 | 33.3 | 5 |
| 1:1 | 50.0 | 2 |
| 0.5:1 | 66.7 | <1 |
| 0.3:1 | 76.9 | <1 |
| 0.1:1 | 90.9 | <1 |
| 0.0:1 | 100 | 3 |

In some embodiments, an exemplary formation method 4 of the thin film with different weight percentages of the QDs includes the following steps.

1) 20 mg of CdTe/CdZnS core-shell QDs are weighed and dissolved them in 10 mL of chlorobenzene to form a QD solution with a concentration of 2 mg/mL. The luminescence peak of this QD solution is at a wavelength of 628 nm, the half-peak width is 32 nm, and the luminescence is 54%.

2) 40 mg, 30 mg, 20 mg, 10 mg, 8 mg, 4 mg, 2 mg, 1 mg, 0.5 mg, 0.3 mg, and 0.1 mg of TFB (weight average molecular weight 50, 000) are weighed separately, and separately dissolved in 0.5 mL of chlorobenzene completely.

3) 0.5 mL of the QD solution prepared in step 1) is added to the above TFB chlorobenzene solution and mixed thoroughly to form TFB/QD chlorobenzene solutions, having weight concentrations (mg/mL) of 40/1, 30/1, 20/1, 10/1, 8/1, 4/1, 2/1, 1/1, 0.5/1, 0.3/1, and 0.1/1, respectively.

4) Thin films are formed under an inert atmosphere environment by a spin-coating process of the above chlorobenzene solution, followed by an annealing process at a temperature of 110° C. for 15 minutes. Thin films with different weight percentages of QDs are then formed.

In some embodiments, the improvement effect of the addition of the too-small molecular weight barrier polymer materials on the thin film luminescence quantum yield is compared.

The luminescence quantum yield of each thin film formed by the exemplary formation method 4 of above-mentioned embodiments is shown in Table 4. Compared with the thin film (last row in Table 4) formed by the pure QD material, when adding different proportions of barrier polymer materials with a molecular weight of only 50,000 (TFB in this example), the luminescence quantum yield is almost not improved. The low molecular weight TFB polymer does not separate the QDs from each other in the thin film effectively.

TABLE 4

| TFB:QD weight concentration ratio (mg/mL) | QD weight percentage (%) | Luminescence quantum yield of thin film (%) |
|---|---|---|
| 40:1 | 2.4 | 5 |
| 30:1 | 3.2 | 3 |
| 20:1 | 4.8 | 3 |
| 10:1 | 9.1 | 2 |
| 8:1 | 11.1 | 3 |
| 4:1 | 20.0 | <1 |
| 2:1 | 33.3 | <1 |
| 1:1 | 50.0 | <1 |
| 0.5:1 | 66.7 | <1 |
| 0.3:1 | 76.9 | <1 |
| 0.1:1 | 90.9 | <1 |
| 0.0:1 | 100 | 3 |

In some embodiments, the exemplary formation method 5 of the thin films (including QDs, a barrier polymer material TFB and a charge transport regulating polymer material polymethyl methacrylate (PMMA)) includes the following steps.

1) 20 mg of CdTe/CdZnS core-shell QDs are weighed and dissolved in 10 mL of chlorobenzene to form a QD solution with a concentration of 2 mg/mL. The luminescence peak of this QD solution is at a wavelength of 605 nm, the half-peak width is 29 nm, and the luminescence quantum yield is 56%.

2) 40/3 mg, 30/2 mg, 20/2 mg, 10/1 mg, 8/0.5 mg, and 4/0.2 mg of TFB (weight average molecular weight 200, 000)/PMMA are weighed separately, and separately dissolved in 0.5 mL of chlorobenzene completely.

3) 0.5 mL of the QD solution prepared in step 1) is added to the above TFB/PMMA chlorobenzene solution and mixed thoroughly to form TFB/QD chlorobenzene solutions, having weight concentrations (mg/mL) of 40/1, 30/1, 20/1, 10/1, 8/1, and 4/1, respectively.

4) Thin films are formed under an inert atmosphere environment by a spin-coating process of the above chlorobenzene solution, followed by an annealing process at a temperature of 110° C. for 15 minutes. Thin films with different weight percentages of QDs are then formed.

The addition of the charge transport regulate polymer material is mainly to improve the charge transport of the thin film applications in the QLED device, which has little effect on the luminescence quantum yield of the thin film itself. Therefore, the effect of improving the thin film luminescence quantum yield is similar to that shown in Table 4.

In some embodiments, an exemplary formation method 6 of the thin film (including QDs, a barrier polymer material PVK and a charge transport regulating polymer material polythiophene) includes the following steps.

1) 20 mg of CdTe/CdZnS core-shell QDs are weighed and dissolved in 10 mL of chlorobenzene to form a QD solution with a concentration of 2 mg/mL. The luminescence peak of this QD solution is at a wavelength of 631 nm, the half-peak width is 30 nm, and the luminescence quantum yield is 56%;

2) 40/1.5 mg, 30/1.0 mg, 20/1.0 mg, 10/0.5 mg, 8/0.3 mg, 4/0.2 mg, 2/0.1 mg. 1/0.3 mg, and 0.5/0.01 mg of PVK (weight average molecular weight 1100,000)/polythiophene are weighed separately, and separately dissolved in 0.5 mL of chlorobenzene completely.

3) 0.5 mL of the QD solution prepared in step 1) is added to the above PVK/polythiophene chlorobenzene solution and mixed thoroughly to form PVK/QD chlorobenzene solutions, having weight concentrations (mg/mL) of 40/1, 30/1, 20/1, 10/1, 8/1, and 4/1, respectively. At this point, the weight percentage of the polythiophene in the polymer material of the charge transport regulating polymer material is less than 5%.

4) Thin films are formed under an inert atmosphere environment by a spin-coating process of the above chlorobenzene solution, followed by an annealing process at a temperature of 120° C. for 15 minutes. Thin films with different weight percentages of QDs are then formed.

The addition of the charge transport regulate polymer material is mainly to improve the charge transport of thin film applications in the QLED devices. The addition has little effect on the luminescence quantum yield of the thin film itself. Therefore, the effect of improving the thin film luminescence quantum yield is similar to that shown in Table 1.

In some embodiments, an exemplary formation method 7 of the thin films (including QDs, a barrier polymer material PVK and a barrier polymer material TFB) includes the following steps.

1) 20 mg of CdTe/CdZnS core-shell QDs are weighed and dissolved in 10 mL of chlorobenzene to form a QD solution with a concentration of 2 mg/mL. The luminescence peak of this QD solution is at a wavelength of 631 nm, the half-peak width is 30 nm, and the luminescence quantum yield is 56%.

2) 20/20 mg, 15/15 mg, 10/10 mg, 5/5 mg, 4/4 mg, 2/2 mg, 1/1 mg. 0.5/0.5 mg, 0.3/0.2 mg, and 0.2/0.1 mg of PVK (weight average molecular weight 1100,000)/TFB (weight average molecular weight 200,000) are weighed separately, and separately dissolved in 0.5 mL of chlorobenzene, completely.

3) 0.5 mL of the QD solution prepared in step 1) is added to the above PVK/TFB chlorobenzene solution and mixed thoroughly to form PVK/TFB/QD chlorobenzene solutions, having weight concentrations (mg/mL) of 20/20/1, 15/15/1, 10/10/1, 5/5/1, 4/4/1, 2/2/1, 1/1/1, 0.5/0.5/1, 0.3/0.2/1, 0.2/0.1/1, respectively.

4) Thin films are formed under an inert atmosphere environment by a spin-coating process of the above chlorobenzene solutions, followed by an annealing process at a temperature of 120° C. for 15 minutes. Thin films with different weight percentages of QDs are then formed.

In some embodiments, the addition of the barrier polymer material improves the luminescence quantum yield of the thin film.

The luminescence quantum yield of each thin film formed by the exemplary formation method 7 of above-mentioned embodiments is shown in Table 5. Compared with the thin film (last row in Table 5) formed by the pure QD material, adding different proportions of the barrier polymer materials (PVK+TFB in the embodiment) to the thin film can significantly improve the luminescence quantum yield of the thin film, e.g., increase the luminescence quantum yield of the thin film from 3% for the pure thin film to 50%. The luminescence quantum yield of the thin film added with the barrier polymer materials is nearly close to the luminescence quantum yield of the QDs in solution, which indicates that PVK+TFB polymer has a desirable isolation effect on the QDs in the thin film. In this example, PVK and TFB have a large weight average molecular weight ~1100,000 and ~200,000, respectively, and for QDs having a weight percentage in a wide range of 2-70%, the luminous efficiency is improved.

TABLE 5

| PVK:TFB:QD weight concentration ratio (mg/mL) | QD weight percentage (%) | Luminescence quantum yield of thin film (%) |
| --- | --- | --- |
| 20:20:1 | 2.4 | 50 |
| 15:15:1 | 3.2 | 35 |
| 10:10:1 | 4.8 | 31 |
| 5:5:1 | 9.1 | 23 |
| 4:4:1 | 11.1 | 16 |
| 2:2:1 | 20.0 | 12 |
| 1:1:1 | 33.3 | 10 |
| 0.5:0.5:1 | 50.0 | 8 |
| 0.3:0.2:1 | 66.7 | 5 |

TABLE 5-continued

| PVK:TFB:QD weight concentration ratio (mg/mL) | QD weight percentage (%) | Luminescence quantum yield of thin film (%) |
| --- | --- | --- |
| 0.2:0.1:1 | 76.9 | 5 |
| 0:0:1 | 100 | 3 |

In some embodiments, an exemplary formation method 8 of the thin films (including QDs, a barrier polymer material TFB, a barrier material poly-TPD, and a charge transport regulating polymer material PMMA) includes the following steps.

1) 20 mg of CdTe/CdZnS core-shell QDs are weighed and dissolved in 10 mL of chlorobenzene to form a QD solution with a concentration of 2 mg/mL. The luminescence peak of this QD solution is at a wavelength of 605 nm, the half-peak width is 29 nm, and the luminescence quantum yield is 56%.

2) 30/10/3 mg, 20/10/2 mg, 15/5/2 mg, 6/4/1 mg, 5/3/0.5 mg, and 3/1/0.2 mg of TFB (weight average molecular weight 200,000)/poly-TPD (weight average molecular weight 120, 000)/PMMA are weighed separately, and separately dissolved in 0.5 mL of chlorobenzene completely.

3) 0.5 mL of the QD solution prepared in step 1) is added to the above TFB/poly-TPD/PMMA chlorobenzene solution and mixed thoroughly to form TFB+poly-TPD/QD chlorobenzene solutions, having weight concentrations (mg/mL) of 40/1, 30/1, 20/1, 10/1, 8/1, and 4/1, respectively. At this point, the weight percentage of the charge transport regulating polymer material PMMA in the polymer material is in the range of 5-10%.

4) Thin films are formed under an inert atmosphere environment by a spin-coating process of the above chlorobenzene solutions, followed by an annealing process at a temperature of 110° C. for 15 minutes. Thin films with different weight percentages of the QDs are then formed.

The addition of the charge transport regulate polymer material is mainly to improve the charge transport of thin film applications in QLED devices. The addition has little effect on the luminescence quantum yield of the thin film. Therefore, the effect of improving the thin film luminescence quantum yield is similar to that shown in Table 2.

Figure 9:
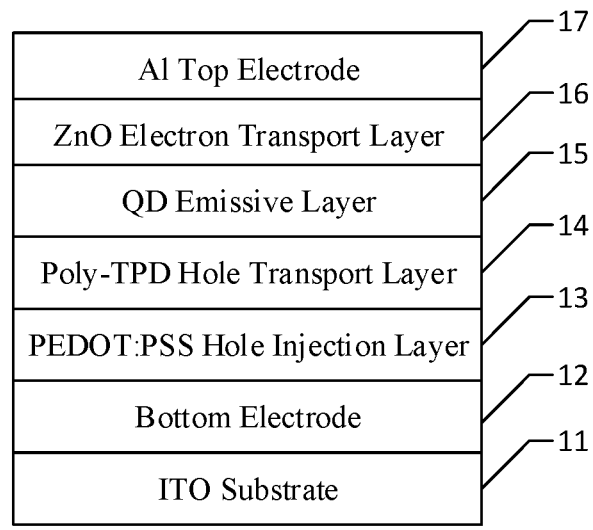
FIG. 9 illustrates a schematic structural diagram of a quantum dot light-emitting diode (QLED) according to some embodiments of the present disclosure.

In some embodiments, the QLED is shown in FIG. 9. As shown in FIG. 9, from bottom to top, QLED includes a ITO substrate 11, a bottom electrode 12, a PEDOT:PSS hole injection layer (i.e., poly(3,4-ethylenedioxythiophene): polystyrene sulfonate) 13, a poly-TPD hole transport layer 14, a QD emissive layer 15, a ZnO electron transport layer 16 and a Al top electrode 17.

An exemplary formation method of the QD emissive layer 15 includes preparing the CdTe/CdZnS QDs (the luminous peak of the solution is at a wavelength of 631 nm, the half-peak width is 30 nm, and the luminescent quantum yield is 56%) with the weight concentration of 1 mg/mL and a toluene solution with the weight concentration of PVK of 20 mg/mL, using the spin coating method to form a thin film at 3000 rpm for 60 seconds, and annealing the thin film at a temperature of 110° C. for 15 minutes under an inert atmosphere environment.

In some embodiments, the above-mentioned thin film improves the efficiency of the QLED device.

In above-mentioned embodiments, the QLED device shown in FIG. 9 using the thin film containing the barrier polymer material PVK as the QD emissive layer has an external quantum efficiency of 3.1% and an electroluminescence peak wavelength of 633 nm.

For comparison, a QLED device using the pure QD material as the QD emissive layer has an external QD efficiency of 0.5% and an electroluminescence peak wavelength of 642 nm.

The efficiency of the QLED device using the QD thin film containing PVK as the QD emissive layer is significantly improved compared to the device without the pure QD added with PVK as the emissive layer. At the same time, the redshift degree of the wavelength of the emissive peak is greatly reduced relative to the wavelength of the solution, which further indicates that PVK is able to effectively weaken the interaction between the QDs.

In some embodiments, the charge transfer regulator polymer improves the efficiency of the QLED device.

A similar device structure and the exemplary formation method used are shown in FIG. 9 in above-mentioned embodiments. An exemplary formation method of the QD emissive layer includes preparing of the CdTe/CdZnS QDs (luminescence peak of the solution is at a wavelength of 631 nm, half-peak width is 30 nm, luminescence quantum yield is 56%) with the weight concentration of 1 mg/mL, PVK weight concentration of 20 mg/mL, and chlorobenzene solution with a polythiophene concentration of 0.8 mg/mL, using the spin coating method to form a thin film at 3000 rpm for 60 seconds, and annealing the thin film at 110° C. for 15 minutes under the inert atmosphere environment.

The QLED device in FIG. 9 using the thin film containing PVK and polythiophene as the QD emissive layer has an external quantum efficiency of 5.1% and an electroluminescence peak wavelength of 633 nm.

As shown, although adding an appropriate amount of polythiophene to the QD thin film containing PVK does not affect the luminescence quantum yield of the QD thin film (the exemplary formation method 6), the higher charge mobility of polythiophene can be used to adjust the charge transport and the corresponding charge balance in the QD emissive layer. Therefore, the method further improves the luminous efficiency of the QD QLED device.

In some embodiments, the charge transfer regulator polymer improves the efficiency of the QLED device.

A similar device structure and the exemplary formation method used are shown in FIG. 9 of above-mentioned embodiments. An exemplary formation method of the QD emissive layer includes preparing the CdTe/CdZnS QDs (luminescence peak of the solution is at a wavelength of 628 nm, half-peak width is 32 nm, luminescence quantum yield is 54%) with weight concentration of 1 mg/mL, TFB with weight concentration of 30 mg/mL, and chlorobenzene solution with a PMMA concentration of 2.5 mg/mL, using the spin coating method to form a thin film at 3000 rpm for 60 seconds, and annealing the thin film at a temperature of 110° C. for 15 minutes under the inert atmosphere environment. At the same time, a QD solution without PMMA is prepared as a comparison and the same method is used to form a thin film.

The QLED device using the thin film containing TFB and PMMA as the QD emissive layer has an external quantum efficiency of 4.3% and an electroluminescence peak wavelength of 631 nm.

The QLED device using the thin film containing only the barrier polymer material TFB as the QD emissive layer has an external quantum efficiency of 2.7% and an electroluminescence peak wavelength of 634 nm.

Although adding an appropriate amount of PMMA to the QD thin film containing TFB does not affect the luminescence quantum yield of the QD thin film (the exemplary formation method 5), the lower charge mobility of PMMA can be used to adjust the charge transport and the corresponding charge balance in the QD emissive layer. Therefore, the method can further improve the luminous efficiency of the QD QLED device.

After using the barrier polymer materials to effectively suppress the interaction between the QDs, the luminous efficiency of the thin film is improved. Therefore, the luminous efficiency of the corresponding QLED device is also improved. At the same time, the smaller redshift of the electroluminescence peak further illustrates the effective suppression of the interaction between the QDs by the barrier polymer materials.

In summary, the embodiments of the present disclosure provide the thin film, the exemplary formation method thereof, and the QLED device. The thin film includes QDs and polymer material. The polymer material is used to effectively separate the QDs from each other and increase a mutual distance between the QDs. As such, the addition of the polymer material reduces the interaction between the QDs and maximizes the suppression non-radiation energy transfer and concentration quenching between the QDs to increase the QD luminescence quantum yield in the thin film. If the molecular weight of the barrier polymer material is too small, the barrier polymer material is unable to achieve a sufficient isolation effect. Thus, the weight average molecular weight of the barrier polymer material that can effectively separate the QDs from each other is required to be higher than 100,000. The higher the molecular weight of the barrier polymer material, the better the isolation effect is between the QDs, and the weight of the QDs that can therefore be accommodated in the QD thin film is higher.

The present disclosure is not limited to the above-mentioned examples. Those skilled in the art can change or modify according to the above description. All the changes and modifications are within the scope of the claims of the present disclosure.

What is claimed is:

1. A thin film, consisting of:
   a polymer material including at least two barrier polymer materials; and
   quantum dots (QDs) dispersed in the polymer material, a weight average molecular weight of the at least two barrier polymer materials being higher than 100,000,
   wherein the at least two barrier polymer materials are dispersed with the QDs in the same thin film, the at least two barrier polymer material being a medium for dispersing the QDs in the thin film, and the at least two barrier polymer materials include:
   one or more of poly(N,N'-Bis(3-methylphenyl)-N,N'-diphenylbenzidine (poly-TPD) and derivatives thereof; and
   one of: poly (9-vinyl carbazole) (PVK) or derivatives thereof, poly (9,9-dioctylfluorene-alt-N-(4-sec-butylphenyl)-diphenylamine) (TFB) or derivatives thereof, and poly (2-methoxy-5-(2'-ethylhexyloxy)-1,4-P-phenylacetylene) (MEH-PPV) or derivatives thereof.

2. The thin film of claim 1, wherein the QDs are oil soluble QDs, and a surface ligand of the oil soluble QDs includes thiol or carboxylic acid.

3. The thin film of claim 2, wherein the QDs include one or more of group II-VI QDs, group III-V QDs, and group IV-VI QDs.

4. The thin film of claim 3, wherein the QDs include Te-containing group II-VI QDs or Cd—Te-containing group II-VI QDs.

5. The thin film of claim 1, wherein a carrier mobility of the at least two barrier polymer materials is above $10^{-8}$ cm$^2$ V$^{-1}$ s$^{-1}$.

6. The thin film of claim 1, wherein a mass fraction of the QDs in the thin film is 0.5-90%.

7. The thin film of claim 6, wherein:
the weight average molecular weight of the at least two barrier polymer materials is between 100,000 and 300,000, and the mass fraction of the QDs in the thin film is 0.5-30%; or
the weight average molecular weight of the at least two barrier polymer materials is between 300,000 and 500,000, and the mass fraction of the QDs in the thin film is 0.5-66%.

8. The thin film of claim 6, wherein the mass fraction of the QDs in the thin film is 0.5-20%, and/or a carrier mobility of the at least two barrier polymer materials is above $10^{-6}$ cm$^2$ V$^{-1}$ s$^{-1}$.

9. The thin film of claim 1, wherein the polymer material dispersed with the QDs in the same thin film further includes at least one charge transport regulating polymer material, and the weight average molecular weight of the at least one charge transport regulating polymer material is lower than 100,000.

10. The thin film of claim 9, wherein a mass fraction of the charge transport regulating polymer material is lower than 10% of the polymer material.

11. The thin film of claim 1, wherein:
the polymer material further comprises one charge transport regulating polymer material;
the weight average molecular weight of the charge transport regulating polymer material is lower than 100,000; and
a mass fraction of the charge transport regulating polymer material is lower than 10% of the polymer material.

12. The thin film of claim 11, wherein:
a carrier mobility of each of the two barrier polymer materials is below $10^{-6}$ cm$^2$ V$^{-1}$ s$^{-1}$,
the charge transport regulating polymer material includes a conducting polymer material; and
the mass fraction of the charge transport regulating polymer material is 0.5-5% of the polymer material.

13. The thin film of claim 12, wherein the conducting polymer includes one of polyacetylene, polyphenylene sulfide, polyaniline, polypyrrole, and polythiophene.

14. The thin film of claim 11, wherein:
a carrier mobility of each of the two barrier polymer materials is above $10^{-6}$ cm$^2$V$^{-1}$ s$^{-1}$,
the charge transport regulating polymer material includes a non-conducting polymer material; and
the mass fraction of the charge transport regulating polymer material is 5-10% of the polymer material.

15. The thin film of claim 14, wherein the non-conducting polymer includes one of phenolic resin, polyethylene, polydimethylsiloxane (PDMS), polystyrene, polymethacrylate, polyacrylate, and polycarbonate.

16. The thin film of claim 1, wherein the weight average molecular weight of the at least two barrier polymer materials is between 500,000 and 1500,000, and the mass fraction of the QDs in the thin film is 0.5-99%.

17. A method for forming a thin film, comprising:
mixing quantum dots (QDs) and a polymer material in a dispersion medium to form a mixed solution; and
forming a thin film from the mixed solution, wherein the thin film includes consists of:
the polymer material and
the quantum dots (QDs) dispersed in the polymer material, the polymer material including at least two barrier polymer materials, the at least two barrier polymer materials being a medium for dispersing the QDs in the thin film, and a weight average molecular weight of the at least two barrier polymer materials being higher than 100,000,
wherein the at least two barrier polymer materials dispersed with the QDs in the same thin film include:
one or more of poly(N,N'-Bis(3-methylphenyl)-N,N'-diphenylbenzidine (poly-TPD) and derivatives thereof; and
one of: poly (9-vinyl carbazole) (PVK) or derivatives thereof, poly (9,9-dioctylfluorene-alt-N-(4-sec-butylphenyl)-diphenylamine) (TFB) or derivatives thereof, and poly (2-methoxy-5-(2'-ethylhexyloxy)-1,4-P-phenylacetylene) (MEH-PPV) or derivatives thereof.

18. A quantum dot light-emitting diode (QLED) device, comprising:
an electron transport layer;
a hole transport layer; and
a quantum dot (QD) emissive layer disposed between the electron transport layer and the hole transport layer, including a thin film, wherein the thin film consists of:
a polymer material; and
quantum dots (QDs) dispersed in the polymer material, the polymer material including at least two barrier polymer materials, the at least two barrier polymer materials being a medium for dispersing the QDs in the thin film, and a weight average molecular weight of the at least two barrier polymer materials being higher than 500,000,
wherein the at least two barrier polymer materials dispersed with the QDs in the same thin film include:
one or more of poly(N,N'-Bis(3-methylphenyl)-N,N'-diphenylbenzidine (poly-TPD) and derivatives thereof; and
one of: poly (9-vinyl carbazole) (PVK) or derivatives thereof, poly (9,9-dioctylfluorene-alt-N-(4-sec-butylphenyl)-diphenylamine) (TFB) or derivatives thereof, and poly (2-methoxy-5-(2'-ethylhexyloxy)-1,4-P-phenylacetylene) (MEH-PPV) or a derivative thereof.

19. The QLED device of claim 18, wherein a mass fraction of the QDs in the thin film is 2-10%.

* * * * *